(12) United States Patent
Russell et al.

(10) Patent No.: US 10,530,191 B2
(45) Date of Patent: Jan. 7, 2020

(54) WIRELESS CHARGING SYSTEM WITH OBJECT DETECTION

(71) Applicant: Apple Inc., Cupertino, CA (US)

(72) Inventors: Antoin J. Russell, San Francisco, CA (US); Bharat K. Patel, San Jose, CA (US); Manisha P. Pandya, Saratoga, CA (US); Zaki Moussaoui, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 234 days.

(21) Appl. No.: 15/804,145

(22) Filed: Nov. 6, 2017

(65) Prior Publication Data

US 2018/0219430 A1 Aug. 2, 2018

Related U.S. Application Data

(60) Provisional application No. 62/453,850, filed on Feb. 2, 2017, provisional application No. 62/526,285, filed on Jun. 28, 2017.

(51) Int. Cl.
*H02J 50/60* (2016.01)
*H02J 50/12* (2016.01)
(Continued)

(52) U.S. Cl.
CPC ............. *H02J 50/60* (2016.02); *G01R 15/18* (2013.01); *H02J 7/025* (2013.01); *H02J 50/12* (2016.02)

(58) Field of Classification Search
CPC ............. H02J 50/10; H02J 50/12; H02J 50/60
See application file for complete search history.

(56) References Cited

U.S. PATENT DOCUMENTS 9,209,627 B2 12/2015 Baarman et al.
2010/0084918 A1 4/2010 Fells et al.
(Continued)

FOREIGN PATENT DOCUMENTS

CN 104124768 A 10/2014
CN 105406552 A 3/2016
(Continued)

OTHER PUBLICATIONS

Strommer et al., NFC-enabled wireless charging, 4th International Workshop on Near Field Communication (NFC), Mar. 13, 2012, IEEE (https://www.researchgate.net/profile/Tuomo_Tuikka/publication/254024004_NFC-Enabled_Wireless_Charging/links/541c19f90c1203f155b355e8/NFC-Enabled-Wireless-Charging.pdf>.

*Primary Examiner* — Fritz M Fleming
(74) *Attorney, Agent, or Firm* — Treyz Law Group, P.C.; G. Victor Treyz; Michael H. Lyons

(57) ABSTRACT

A wireless power transmitting device transmits wireless power signals to a wireless power receiving device using an output circuit that includes a wireless power transmitting coil. Measurement circuitry is coupled to the output circuit to help determine whether the wireless power receiving device is present and ready to accept transmission of wireless power. The measurement circuitry includes a measurement circuit that is coupled to the output circuit and that measures signals while oscillator circuitry supplies the output circuit with signals at a probe frequency. The measurement circuitry also includes a measurement circuit that is coupled to the output circuit and that measures signals while the oscillator circuitry sweeps signals applied to the output circuit between a first frequency and a second frequency to detect sensitive devices such as radio-frequency identification devices. Impulse response circuitry in the measurement (Continued)

circuitry is used to make inductance and Q factor measurements.

20 Claims, 10 Drawing Sheets

(51) Int. Cl.
*G01R 15/18* (2006.01)
*H02J 7/02* (2016.01)

(56) References Cited

U.S. PATENT DOCUMENTS

| | | | |
|---|---|---|---|
| 2011/0221388 A1* | 9/2011 | Low | H02J 50/12 |
| | | | 320/108 |
| 2011/0281535 A1 | 11/2011 | Low et al. | |
| 2013/0119926 A1 | 5/2013 | Lin | |
| 2013/0162054 A1 | 6/2013 | Komiyama | |
| 2015/0145471 A1 | 5/2015 | Huijser | |
| 2015/0207340 A1* | 7/2015 | McFarthing | H02J 50/12 |
| | | | 320/108 |
| 2015/0285926 A1 | 10/2015 | Oettinger | |
| 2015/0349543 A1 | 12/2015 | Skata et al. | |
| 2016/0099578 A1 | 4/2016 | Hwang | |
| 2016/0322853 A1 | 11/2016 | Porat et al. | |
| 2017/0098149 A1 | 4/2017 | Kesler et al. | |

FOREIGN PATENT DOCUMENTS

| | | |
|---|---|---|
| EP | 3124313 A1 | 2/2017 |
| WO | 2012099965 A2 | 7/2012 |
| WO | 2016076733 A1 | 5/2016 |
| WO | 2016140582 A1 | 9/2016 |

* cited by examiner

WIRELESS CHARGING SYSTEM WITH OBJECT DETECTION

This application claims the benefit of provisional patent application No. 62/453,850, filed on Feb. 2, 2017, and provisional patent application No. 62/526,285, filed on Jun. 28, 2017, which are hereby incorporated by reference herein in their entireties.

FIELD

This relates generally to wireless systems, and, more particularly, to systems in which devices are wirelessly charged.

BACKGROUND

In a wireless charging system, a wireless power transmitting device such as a device with a charging surface wirelessly transmits power to a portable electronic device. The portable electronic device receives the wirelessly transmitted power and uses this power to charge an internal battery or to power the device. In some situations, foreign objects may be accidentally place on a charging surface. This can pose challenges when performing wireless power transmission operations.

SUMMARY

A wireless power transmitting device transmits wireless power signals to a wireless power receiving device. The wireless power transmitting device has an inverter that supplies signals to an output circuit that includes a wireless power transmitting coil. The wireless power transmitting coil may be part of an array of wireless power transmitting coils that cover a wireless charging surface associated with the wireless power transmitting device.

Signal measurement circuitry is coupled to the output circuit to help determine whether the wireless power receiving device is present and ready to accept transmission of wireless power. The measurement circuitry includes a measurement circuit that is coupled to the output circuit and that measures signals while oscillator circuitry supplies the output circuit with signals at a probe frequency. Using measurements from this measurement circuitry at one or more probe frequencies, the wireless power transmitting device determines whether an external object is present on the coils.

Impulse response circuitry in the measurement circuitry is coupled to the output circuit and used to measure the response of the output circuit to an impulse signal supplied by an inverter in the wireless power transmitting device. The impulse response circuitry is used to make inductance and Q factor measurements.

During operation, information from the impulse response circuitry and measurements at the probe frequency can be used in determining whether a wireless receiving device is present over particular coils in wireless charging surface and can therefore be used in adjusting wireless power transmission with the wireless power transmitting device.

The measurement circuitry also includes a measurement circuit that is coupled to the output circuit and that measures signals while the oscillator circuitry sweeps an alternating-current output signal between a first frequency and a second frequency. Measurements resulting from frequency-sweeping operations are used to detect sensitive devices such as radio-frequency identification devices. If sensitive devices are detected, potentially damaging wireless power transmission operations can be avoided.

Switching circuitry is used to dynamically switch selected coils from the coil array that overlaps the charging surface into the output circuit, so that appropriate coils in the coil array can be probed for the presence of external objects and sensitive devices such as radio-frequency identification devices.

DETAILED DESCRIPTION

A wireless power system has a wireless power transmitting device that transmits power wirelessly to a wireless power receiving device. The wireless power transmitting device is a device such as a wireless charging mat, wireless charging puck, wireless charging stand, wireless charging table, or other wireless power transmitting equipment. The wireless power transmitting device has one or more coils that are used in transmitting wireless power to one or more wireless power receiving coils in the wireless power receiving device. The wireless power receiving device is a device such as a cellular telephone, watch, media player, tablet computer, pair of earbuds, remote control, laptop computer, other portable electronic device, or other wireless power receiving equipment.

During operation, the wireless power transmitting device supplies alternating-current signals to one or more wireless power transmitting coils. This causes the coils to transmit alternating-current electromagnetic signals (sometimes referred to as wireless power signals) to one or more corresponding coils in the wireless power receiving device. Rectifier circuitry in the wireless power receiving device converts received wireless power signals into direct-current (DC) power for powering the wireless power receiving device.

Figure 1:
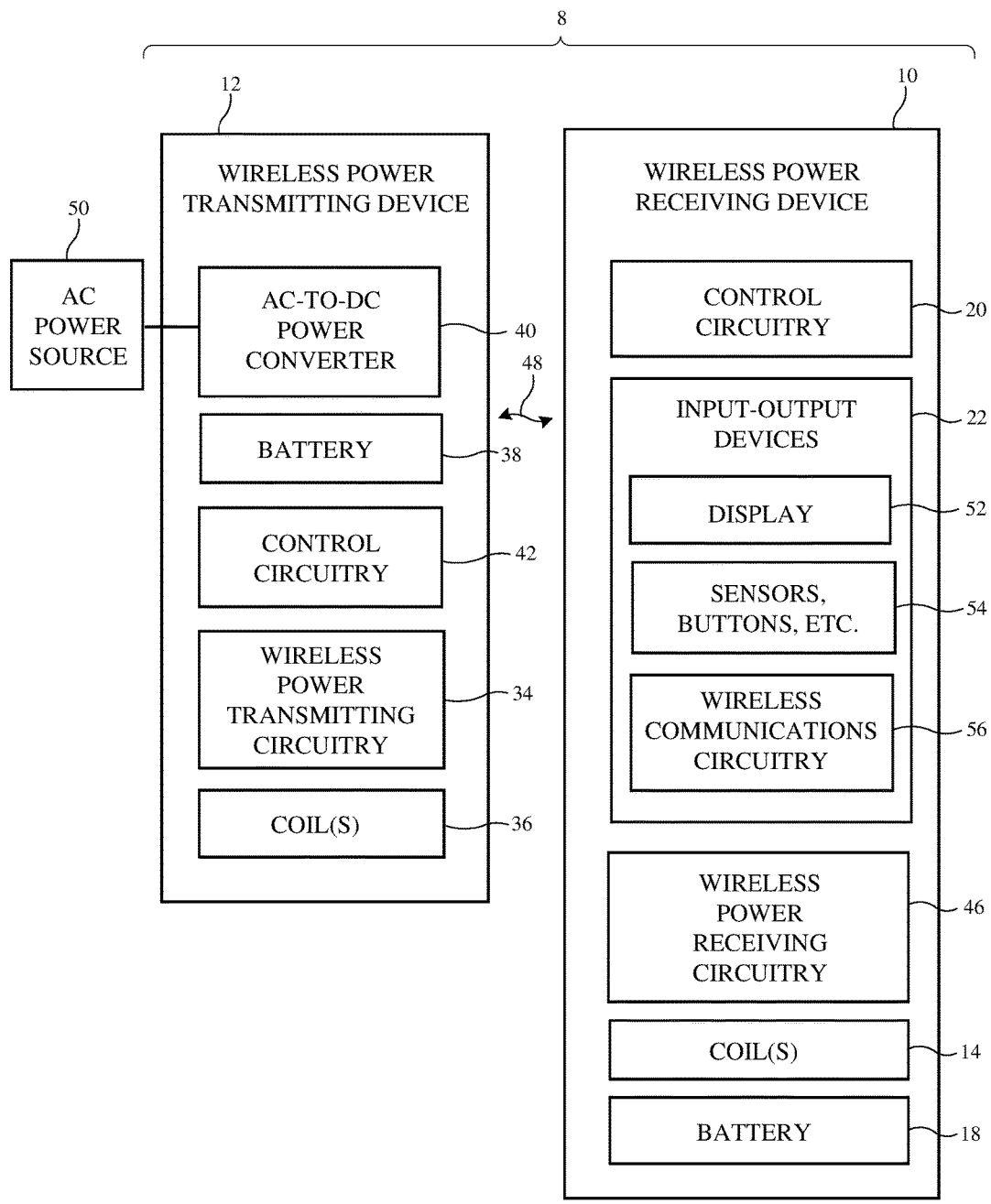
FIG. 1 is a schematic diagram of an illustrative wireless charging system in accordance with some embodiments.

An illustrative wireless power system (wireless charging system) is shown in FIG. 1. As shown in FIG. 1, wireless power system 8 includes wireless power transmitting device 12 and one or more wireless power receiving devices such as wireless power receiving device 10. Device 12 may be a stand-alone device such as a wireless charging mat, may be built into furniture, or may be other wireless charging equipment. Device 10 is a portable electronic device such as a wristwatch, a cellular telephone, a tablet computer, or other electronic equipment. Illustrative configurations in which device 12 is a mat or other equipment that forms a wireless charging surface and in which device 10 is a portable electronic device that rests on the wireless charging surface during wireless power transfer operations may sometimes be described herein as an example.

During operation of system 8, a user places one or more devices 10 on the charging surface of device 12. Power transmitting device 12 is coupled to a source of alternating-current voltage such as alternating-current power source 50 (e.g., a wall outlet that supplies line power or other source of mains electricity), has a battery such as battery 38 for supplying power, and/or is coupled to another source of power. A power converter such as AC-DC power converter 40 can convert power from a mains power source or other AC power source into DC power that is used to power control circuitry 42 and other circuitry in device 12. During operation, control circuitry 42 uses wireless power transmitting circuitry 34 and one or more coils 36 coupled to circuitry 34 to transmit alternating-current electromagnetic signals 48 to device 10 and thereby convey wireless power to wireless power receiving circuitry 46 of device 10.

Power transmitting circuitry 34 has switching circuitry (e.g., transistors in an inverter circuit) that are turned on and off based on control signals provided by control circuitry 42 to create AC current signals through appropriate coils 36. As the AC currents pass through a coil 36 that is being driven by the inverter circuit, alternating-current electromagnetic fields (wireless power signals 48) are produced that are received by one or more corresponding coils 14 coupled to wireless power receiving circuitry 46 in receiving device 10. When the alternating-current electromagnetic fields are received by coil 14, corresponding alternating-current currents and voltages are induced in coil 14. Rectifier circuitry in circuitry 46 converts received AC signals (received alternating-current currents and voltages associated with wireless power signals) from one or more coils 14 into DC voltage signals for powering device 10. The DC voltages are used in powering components in device 10 such as display 52, touch sensor components and other sensors 54 (e.g., accelerometers, force sensors, temperature sensors, light sensors, pressure sensors, gas sensors, moisture sensors, magnetic sensors, etc.), wireless communications circuits 56 for communicating wirelessly with control circuitry 42 of device 12 and/or other equipment, audio components, and other components (e.g., input-output devices 22 and/or control circuitry 20) and are used in charging an internal battery in device 10 such as battery 18.

Devices 12 and 10 include control circuitry 42 and 20. Control circuitry 42 and 20 includes storage and processing circuitry such as microprocessors, power management units, baseband processors, digital signal processors, microcontrollers, and/or application-specific integrated circuits with processing circuits. Control circuitry 42 and 20 is configured to execute instructions for implementing desired control and communications features in system 8. For example, control circuitry 42 and/or 20 may be used in determining power transmission levels, processing sensor data, processing user input, processing other information such as information on wireless coupling efficiency from transmitting circuitry 34, processing information from receiving circuitry 46, using information from circuitry 34 and/or 46 such as signal measurements on output circuitry in circuitry 34 and other information from circuitry 34 and/or 46 to determine when to start and stop wireless charging operations, adjusting charging parameters such as charging frequencies, coil assignments in a multi-coil array, and wireless power transmission levels, and performing other control functions. Control circuitry 42 and/or 20 may be configured to perform these operations using hardware (e.g., dedicated hardware or circuitry) and/or software (e.g., code that runs on the hardware of system 8). Software code for performing these operations is stored on non-transitory computer readable storage media (e.g., tangible computer readable storage media). The software code may sometimes be referred to as software, data, program instructions, instructions, or code. The non-transitory computer readable storage media may include non-volatile memory such as non-volatile random-access memory (NVRAM), one or more hard drives (e.g., magnetic drives or solid state drives), one or more removable flash drives or other removable media, other computer readable media, or combinations of these computer readable media or other storage. Software stored on the non-transitory computer readable storage media may be executed on the processing circuitry of control circuitry 42 and/or 20. The processing circuitry may include application-specific integrated circuits with processing circuitry, one or more microprocessors, or other processing circuitry.

Device 12 and/or device 10 may communicate wirelessly. Devices 10 and 12 may, for example, have wireless transceiver circuitry in control circuitry 42 and 20 (and/or wireless communications circuitry such as circuitry 56 of FIG. 1) that allows wireless transmission of signals between devices 10 and 12 (e.g., using antennas that are separate from coils 36 and 14 to transmit and receive unidirectional or bidirectional wireless signals, using coils 36 and 14 to transmit and receive unidirectional or bidirectional wireless signals, etc.).

Figure 2:
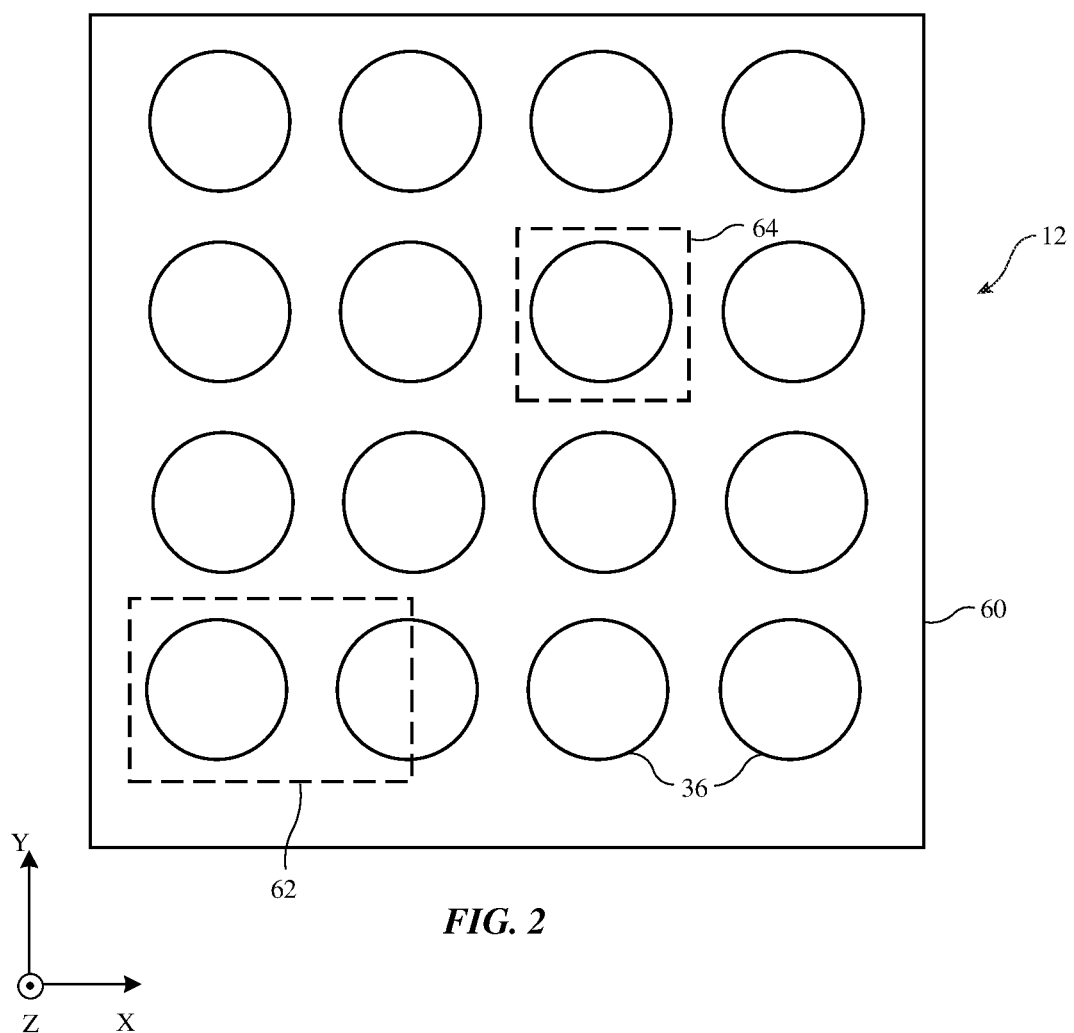
FIG. 2 is a top view of an illustrative wireless power transmitting device with an array of coils that forms a wireless charging surface in accordance with an embodiment.

With one illustrative configuration, wireless transmitting device 12 is a wireless charging mat or other wireless power transmitting equipment that has an array of coils 36 that supply wireless power over a wireless charging surface. This type of arrangement is shown in FIG. 2. In the example of FIG. 2, device 12 has an array of coils 36 that lie in the X-Y plane. Coils 36 of device 12 are covered by a planar dielectric structure such as a plastic member or other structure forming charging surface 60. The lateral dimensions (X and Y dimensions) of the array of coils 36 in device 36 may be 1-1000 cm, 5-50 cm, more than 5 cm, more than 20 cm, less than 200 cm, less than 75 cm, or other suitable size. Coils 36 may overlap or may be arranged in a non-overlapping configuration. Coils 36 can be placed in a rectangular array having rows and columns and/or may be tiled using a hexagonal tile pattern or other pattern.

During operation, a user places one or more devices 10 on charging surface 60. Foreign objects such as coils, paper clips, scraps of metal foil, and/or other foreign conductive objects may be accidentally placed on surface 60. System 8 automatically detects whether conductive objects located on surface 60 correspond to devices 10 or incompatible foreign objects and takes suitable action. With one illustrative arrangement, system 8 checks whether objects located on surface 60 include sensitive items such as radio-frequency identification (RFID) devices or other potentially sensitive electronic equipment that could be potentially damaged upon exposure to large fields from coils 36 before system 8 allows wireless power to be transmitted to those objects.

As shown in the example of FIG. 2, external objects such as external object 62 and object 64 may overlap one or more coils 36. In some situations, objects 62 and 64 will be portable electronic devices 10. In other situations, one or more of objects 62 and 64 will be incompatible external objects (e.g., conductive foreign objects such as metallic coins, sensitive devices such as RFID devices, etc.). Situations may also arise in which incompatible external objects and portable electronic devices overlap the same coil or coils 36.

Figure 3:
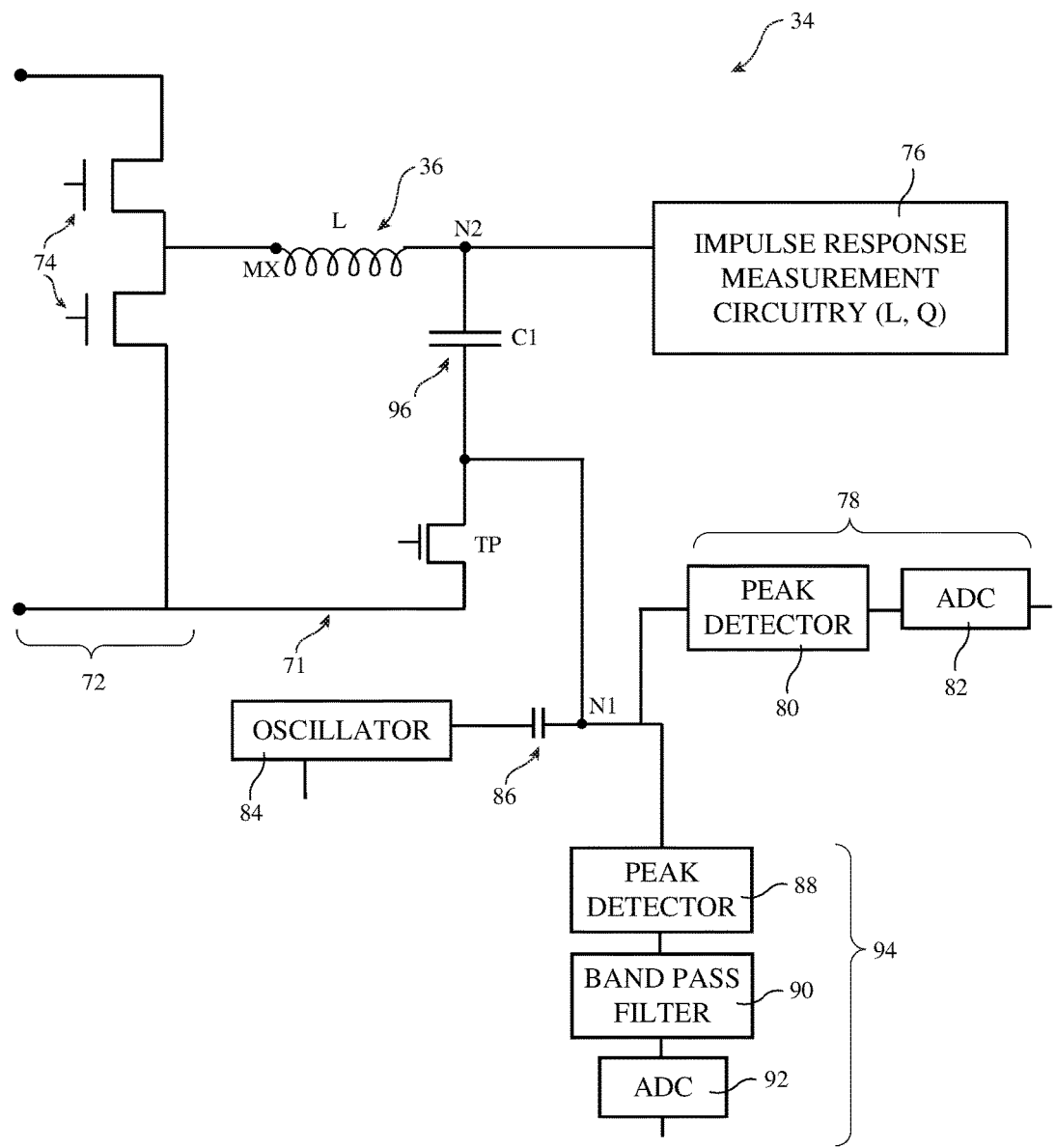
FIG. 3 is a circuit diagram of illustrative wireless power transmitting circuitry with output circuit signal measurement circuitry in a wireless power transmitting device in accordance with an embodiment.

Illustrative wireless power transmitting circuitry 34 that includes circuitry to detect and characterize external objects on surface 60 is shown in FIG. 3. As shown in FIG. 2, circuitry 34 may include an inverter such as inverter 72 or other drive circuit that produces wireless power signals that are transmitted through an output circuit that includes one or more coils 36. A single coil 36 is shown in the example of FIG. 2. In general, device 12 may have any suitable number of coils 36 (1-100, more than 5, more than 10, fewer than 40, fewer than 30, 5-25, etc.). Switching circuitry MX (sometimes referred to as multiplexer circuitry) that is controlled by control circuitry 42 can be located before and/or after each coil 36 and/or before and/or after the other components of output circuit 71 and can be used to switch desired sets of one or more coils 36 (desired output circuits 71) into or out of use. For example, if it is determined that object 62 of FIG. 2 is a wireless power receiving device 10 and object 64 is an incompatible foreign object such as a coin, the coils overlapping object 62 may be activated during wireless power transmission operations and the coils under object 64 may be deactivated so that these coils do not transmit wireless power. Other coils 36 (e.g., coils not overlapped by object 64 in this example) can also be turned off during wireless power transmission operations, if desired.

With continued reference to FIG. 3, during wireless power transmission operations, transistors 74 of inverter 72 are driven by AC control signals from control circuitry 42. Control circuitry 42 may also use transistors 74 of inverter 72 to apply square wave pulses or other impulses to coil 36 (e.g., during impulse response measurements). Coil 36 (e.g., a coil that has been selected using multiplexing circuitry MX) has an inductance L. Capacitor 96 has a capacitance C1 that is coupled in series with inductance L in output circuit 90. When supplied with alternating-current drive signals from inverter 72 while switch (transistor) TP is closed, the output circuit formed from coil 36 and capacitor 96 produces alternating-current electromagnetic fields that are received by one or more coils 14 in device 10. The inductance L of each coil 36 is influenced by magnetic coupling with external objects, so measurements of inductance L for one or more of coils 36 in device 12 at various frequencies can reveal information on objects on charging surface 60.

To conserve power, device 12 may be operated in a standby mode while awaiting use to supply wireless power to devices 10. The signal measurement circuitry of FIG. 3 (sometimes referred to as output circuit signal measurement circuitry, external or foreign object detection circuitry, etc.) monitors for the presence of external objects during standby. The power consumption of the measurement circuitry in transmitter circuitry 34 during standby operations may be less than 50 mW, less than 200 mW, more than 1 mW, or other suitable value.

In standby mode, device 12 periodically scans coils 36 (e.g., device 12 scans each of coils 36) for the presence of external objects (e.g., devices 10, foreign objects such as coins, etc.). To probe a selected coil for changes in inductance L due to external objects, a probe signal is driven onto node N1 with oscillator circuitry 84 while control circuitry 42 turns off inverter 72 (e.g., transistors 74 are not used to drive signals onto node N2). Control circuitry 42 may, for example, use oscillator circuitry 84 (e.g., one or more voltage controlled oscillators, one or more other adjustable oscillators, and/or other oscillatory circuitry) to produce an alternating-current probe signal (e.g., a sine wave, square wave, etc.) at a probe frequency fr (e.g., 4 MHz or other suitable frequency such as a frequency of at least 500 kHz, at least 1 MHz, at least 2 MHz, less than 10 MHz, between 1 MHz and 10 MHz, or other suitable frequency). The probe frequency fr that is used during standby mode is a frequency that differs from RFID frequencies such as 13.56 MHz and that differs from the normal alternating-current frequency supplied to output circuit 71 by inverter 72 during wireless charging operations, which may be, for example, 100-500 kHz, more than 50 kHz, more than 100 kHz, more than 200 kHz, less than 450 kHz, less than 400 kHz, less than 300 kHz, or other suitable wireless power alternating-current drive frequency.

The signal at frequency fr is applied to node N1 via capacitor 86 and coupled to coil 36 via capacitor 96 while inverter 72 is held in an off state by control circuitry 42. Control circuitry 42 controls multiplexer MX to select the coil to which the signal at frequency fr is applied (e.g., coil 36 of FIG. 3) from the array of coils 36 of device 12 shown in FIG. 2. Capacitance C1 may have a value of 150 μF, more than 10 μF, less than 1000 μF, or other suitable value. Transistor TP may have a parasitic capacitance Cp (e.g., a capacitance of 80 pF, more than 10 pF, less than 800 pF, or other suitable value) when open. For standby operations, control circuitry 42 opens transistor TP so that so that probe signals are routed through coil 36. When transistor TP is open, parasitic capacitance Cp is coupled in series with capacitance C1. This effectively removes capacitance C1 from the series circuit formed with inductance L, as the capacitance of capacitance C1 (which is in the microfarad range) and Cp (which is in the picofarad range) in series will be approximately Cp.

With TP open, output circuit 71 (coil 36 in series with C1 and Cp) will be characterized by a resonance at frequency fres of equation 1.

$$fres = 1/(2\pi(LCp)^{1/2}) \qquad (1)$$

Figure 4:
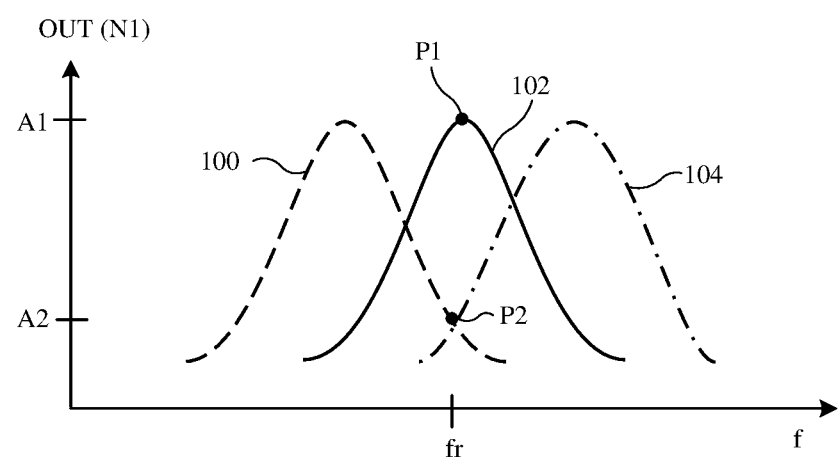
FIG. 4 is a graph showing the response of various illustrative objects on the surface of a wireless power transmitting device in accordance with an embodiment.

The expected measured signal at node N1 (output voltage OUT(N1)) as a function of applied signal frequency f in the absence of external objects on coil 36 is given by curve 102 of FIG. 4. In the presence of an electronic device such as device 10 that contains one or more coils 14 overlapping coil 36, curve 102 may shift to lower frequencies as shown by curve 100. In the presence of a coin or other incompatible foreign object overlapping coil 36, curve 102 may shift to higher frequencies as shown by curve 104. Changes in load can be detected by monitoring the value of OUT(N1) using measurement circuit 78 of FIG. 3 at one or more probe frequencies. For example, oscillator circuitry 84 may be used to apply a probe signal to node N1 at a frequency fr that has been chosen to match resonant frequency fres of equation 1. If desired, multiple probe signals may be applied to output circuit 72 while using measurement circuitry to evaluate the resulting signal on node N1. For example, the direction of change in curve 102 (shifting higher or lower) can be detected by taking multiple measurements of OUT (N1) at two or more frequencies near frequency fr of FIG. 4).

To make measurements of OUT(N1), measurement circuit 78 includes peak detector 80 and analog-to-digital converter 82. Circuit 78 measures the signal at node N1 and supplies a corresponding digital version of this signal to control circuitry 42. In the presence of an object overlapping coil 36 (whether from device 10, a sensitive RFID device, or a coin or other incompatible foreign object), signal OUT (N1) will drop. For example, the signal on node N1 may drop from a value of P1 (e.g., a peak value associated with curve 102) when coil 36 is unloaded to a value of P2 (a reduced value associated with shifted curve 100) when coil 36 is loaded due to the presence of an external object.

During standby operations, control circuitry 42 can scan through coils 36 by using multiplexer circuitry MX or other switching circuitry in circuitry 34. In some embodiments, this sequentially couples each of coils 36 to node N1 while circuitry 78 measures OUT(N1) for each selected coil 36. If no changes in OUT(N1) are detected, control circuitry 42 can conclude that no objects are present on device 12 (e.g., no objects are resting on charging surface 60). If a change in OUT(N1) is detected, control circuitry 42 performs additional operations to confirm that device 10 is present rather than an incompatible foreign object such as a coin.

With one illustrative approach, control circuitry 42 uses impulse response measurement circuitry 76 (sometimes referred to as inductance measurement circuitry and/or Q factor measurement circuitry) to perform low-frequency measurements of inductance L and quality factor Q in response to detection of a load on one or more coils 36 during standby. During impulse response measurements, control circuitry 42 directs inverter 72 to supply one or more excitation pulses (impulses) to coil 36 while turning on transistor TP, so that L and C1 in output circuit 71 form a resonant circuit. The impulses may be, for example, square wave pulses of 1 µs in duration. Longer or shorter pulses may be applied, if desired. The resonant circuit may resonate at a frequency near to the normal wireless charging frequency of coil 36 (e.g., about 320 kHz, 100-500 kHz, more than 50 kHz, more than 100 kHz, more than 200 kHz, less than 450 kHz, less than 400 kHz, less than 300 kHz, or other suitable wireless charging frequency).

Figure 5:
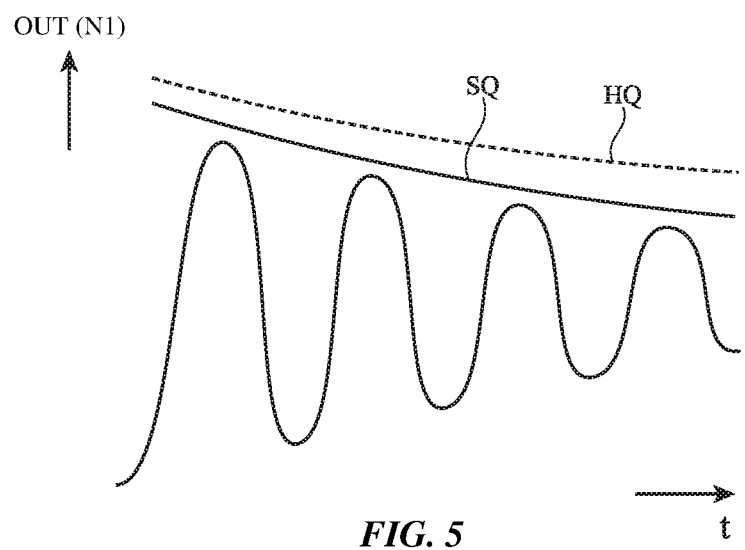
FIG. 5 is a graph of an illustrative impulse response of the type that may be used to characterize objects on a wireless power transmitting device in accordance with an embodiment.

The impulse response (signal OUT(N1)) of circuit 71 to the applied pulse(s) is as shown in FIG. 5. The frequency of the impulse response signal of FIG. 5 is proportional to $1/\sqrt{LC}$, so L can be obtained from the known value of C1 and the measured frequency of the impulse response signal. Q may be derived from L and the measured decay of the impulse response signal. As shown in FIG. 5, if signal OUT(N1) decays slowly, Q is high (e.g., HQ) and if signal OUT(N1) decays more rapidly, Q is low (e.g., SQ). Measurement of the decay envelope of OUT(N1) and frequency of OUT(N1) of the impulse response signal of FIG. 5 with circuitry 76 will therefore allow control circuitry 42 to determine Q and L.

If the measured value of L for a given coil matches the normal L value expected for each of coils 36 in the array of coils 36 overlapping surface 60 (e.g., when the measured L value is not influenced by the presence device 10 or other external object on surface 60), control circuitry 42 can conclude that no external object suitable for wireless charging is present. If a given measured value of L is larger than that expected for an unloaded coil, control circuitry 42 can conclude that an external object is present that is suitable for wireless charging and can perform additional measurement operations. For example, control circuitry 42 can perform a swept-frequency measurement (sometimes referred to as an RFID checking measurement) on node N1 to check whether a sensitive device such as an RFID device is present on surface 60.

The measurements made by circuitry 76 are performed on one or more of coils 36 (e.g., these measurements may be performed on each of coils 36 in the array of coils in device 12). Circuitry 42 uses these impulse response measurements to identify spatial patterns in measured L values (and/or Q factor values) across surface 60. Analysis of a pattern of measured inductance (L) change can help determine whether a known type of device 10 is present on coils 36. Analysis of the spatial patterns of measured inductance L (and, if desired, Q factor, which has an inverse relationship with respect to L), as a function of coil position in the X-Y plane of surface 60 may be used in determining when to transit wireless power from device 12 to device 10. If, for example, the value of L for each of coils 36 is unchanged from its nominal state, circuitry 42 can conclude that no external device suitable for wireless charging is present. If the value of L for a given one of coils 36 is elevated or other suitable pattern of measured L values is detected, circuitry 42 can conclude that an external device that is suitable for wireless charging is present on that coil and can prepare to transmit wireless power using that coil.

Before transmitting wireless power, it may be desirable to check whether a sensitive device such as an RFID device is present on surface 60. Sensitive devices can potentially be harmed by excessive wireless power levels, so checking for sensitive devices helps avoid damage to sensitive devices during subsequent wireless power transfer operations. In some scenarios, both portable device 10 and a sensitive device may be present over the same coil 36 in the array of coils 36 in device 12. A sensitive device may, as an example, be present under a cellular telephone, watch, or other portable device 10 that includes a wireless power receiving coil 14. Even though the presence of the portable device 10 can be detected by making inductance measurements with coils 36, it is desirable to check whether a sensitive device is also present so as to avoid damaging the sensitive device by exposure to wireless power transmissions.

Radio-frequency identification (RFID) devices typically have RFID coil circuits that resonate at relatively high frequencies such as a frequency of 13.56 MHz. In some embodiments, to determine if an RFID is present on surface 60, RFID checking measurements are performed by measuring signal OUT(N1) on node N1 using measurement circuit 94 (FIG. 3). During these checking measurements, control circuitry 42 directs oscillator circuitry 84 to sweep the frequency of the signal supplied to node N1 between a first frequency f1 and a second frequency f2 covering the expected resonant frequencies of popular RFID coils. Transistor TP may remain open so that current from oscillator circuitry 84 flows through each coil 36 that has been selected during measurement operations. The value of f1 may be, for example, 10 MHz, more than 5 MHz, less than 11 MHz, less than 12 MHz, less than 15 MHz, or other suitable value. The value of f2 may be 30 MHz, more than 14 MHz, more than 15 MHz, more than 20 MHz, less than 45 MHz, or other suitable value.

As shown in FIG. 3, swept-frequency measurement circuit 94 includes a peak detector such as peak detector 88 that measures the voltage on node N1, band pass filter 90, and analog-to-digital converter circuitry 92. Analog-to-digital converter circuitry 92 supplies a digital version of its input to control circuitry 42.

Figure 6:
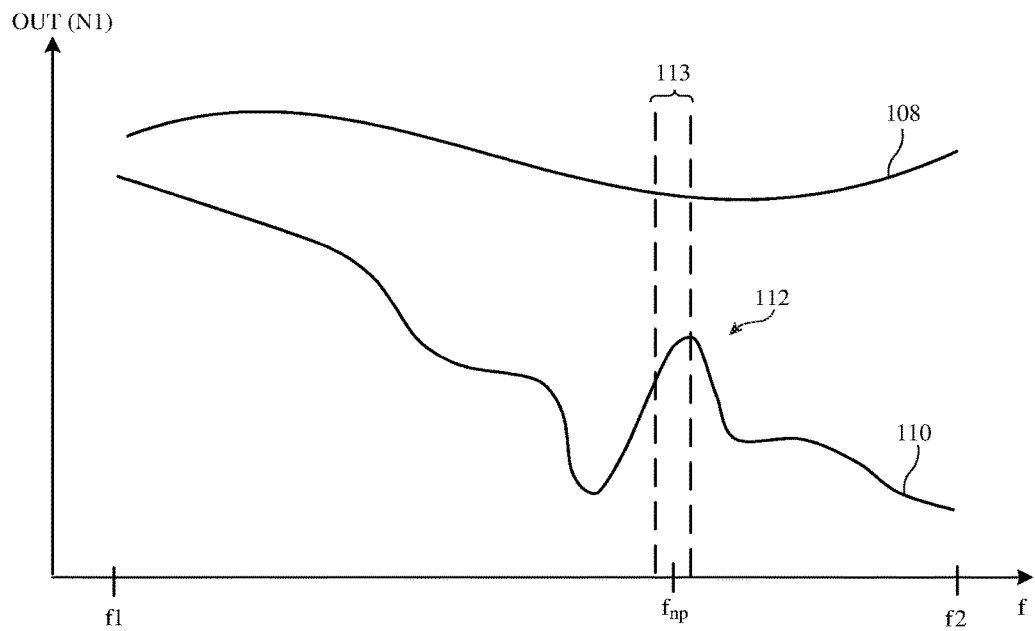
FIG. 6 is a graph showing output signal traces of the type that may be associated with placing a sensitive object such as a radio-frequency identification device on the surface of a wireless power transmitting device in accordance with an embodiment.
Figure 6:
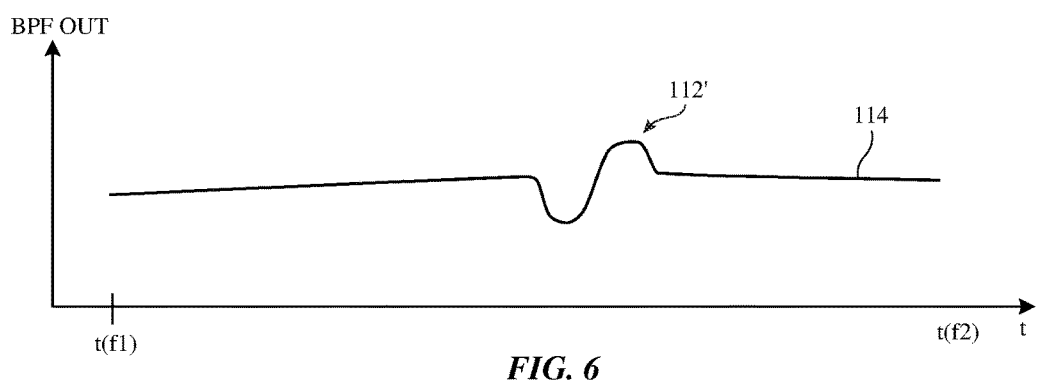

When no RFID device is present on charging surface 60 of device 12, peak detector 88 will detect a signal such as the signal of curve 108 in FIG. 6. When an RFID device overlaps charging surface 60, signal OUT(N1) (see, e.g., curve 110) will exhibit a resonance signal such as signal 112 in as frequency f is swept between f1 and f2. Resonance signal 112 may, for example, correspond to a resonance frequency such as an RFID resonant frequency of 13.56 MHz.

Frequency f is swept between f1 and f2 at a predetermined speed. For example, control circuitry 42 may sweep frequency from f1 to f2 in an interval of 2 ms, at least 1 ms, less than 3 ms, or other suitable time period. The pass frequency of band pass filter 90 is selected so that resonance signal 112 will pass through band pass filter 90 as band pass filtered signal 112' of band pass output curve 114 when frequency f is changed between f1 and f2 at the predetermined speed (e.g., when the full sweep range is covered in an interval of 2 ms, etc.). The use of band pass filter 90 helps remove non-resonant signal fluctuations from curve 110 (e.g., signal tilt and slowly varying increases and/or decreases of the type shown by illustrative curve 110 of FIG. 6). The resulting band-pass-filtered signal (curve 114 and filtered signal resonance 112') can be processed by control circuitry 42 to confirm that an RFID resonance at a particular frequency has been detected. Control circuitry 42 can then take appropriate action. For example, if no RFID signature is detected, control circuitry 42 can conclude that the detected external object on surface 60 is likely a portable device (device 10 with coil 14) without any intervening (overlapping) sensitive RFID device. If an RFID signature (e.g., resonant signal 112' at an RFID frequency such as 13.56 MHz) is detected, control circuitry 42 can reduce the level of wireless power transmitted by coils 36 or can prevent wireless power from being transmitted by coils 36 (or at least the coils that are overlapped by the sensitive RFID device) so as to mitigate damage to the RFID device. Optionally, control circuit 42 can issue an alert to a user.

In some arrangements, it may be desirable to avoid sensitive frequencies during the frequency sweep operations of FIG. 6. For example, it may be desirable to skip a narrow band of frequencies centered on an unpermitted frequency fnp such as band 113. Unpermitted frequency fnp may be, as an example, a frequency of 13.56 MHz. Band 113 may cover frequencies within +/−20 kHz of 13.56 MHz (as an example). Skipping band 113 during the frequency sweep from f1 to f2 may ensure regulatory compliance in jurisdictions in which use of the frequencies of band 113 is restricted. To facilitate skipping of band 113, oscillator 84 may be implemented using a circuit that permits rapid skipping of undesired frequencies during frequency sweeping such as a direct digital sine wave generator. Other types of oscillator may be used, if desired.

Figure 7:
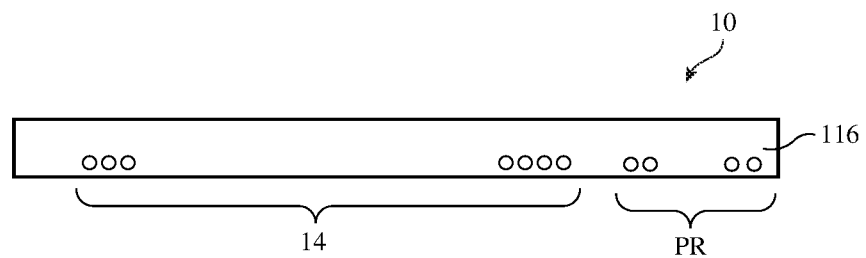
FIG. 7 is a cross-sectional side view of an illustrative portable electronic device that has a wireless power receiving coil and an ancillary coil that forms a resonant circuit in accordance with an embodiment.

FIG. 7 is a cross-sectional side view of device 10 in an illustrative configuration in which device 10 has a power receiving coil (coil 14) located in the lower portion of device housing 116. Device may also have one or more additional coils such as coil PR. Each optional coil PR may form part of a corresponding resonant circuit (e.g., a passive resonant circuit with a known frequency resonance at a frequency between 10 MHz and 30 MHz or other suitable frequency). The measurement circuitry of device 12 can detect the presence and location of coils such as coil PR when scanning frequency f for each coil 36 as described in connection with FIG. 6. The incorporation of known passive resonators into device 10 may help allow the location, orientation, and type of device 10 to be accurately identified by device 12.

Figure 8:
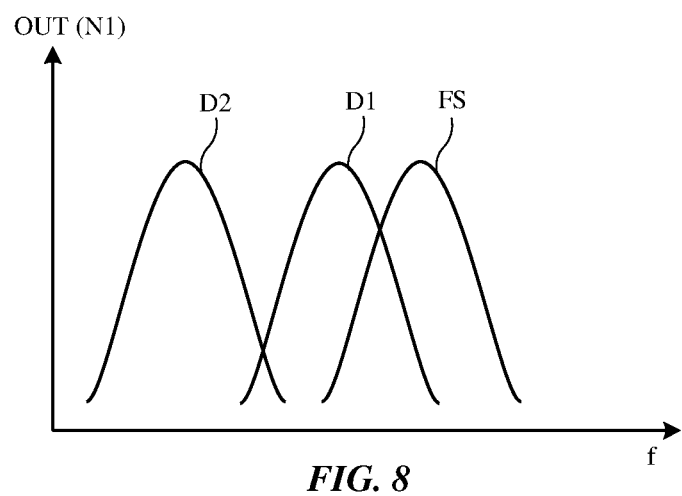
FIG. 8 is a graph in which output circuit signal measurements as a function of frequency have been plotted for multiple types of illustrative objects on the surface of a wireless power transmitting device in accordance with an embodiment.

Different devices may also have different known frequency resonances when placed on surface 60. Consider, for example, the scenario of FIG. 8. In the absence of an external object, coil 36 may exhibit a frequency response of the type shown by curve FS. When a first type of device 10 (e.g., a cellular telephone) is placed on surface 60, curve FS may shift to curve D1. When a second type of device 10 (e.g., a watch) is placed on surface 60, curve FS may shift to curve D2. By measuring OUT(N1) by sweeping across a predetermined frequency range (e.g., from a low frequency of 1 kHz, 10 kHz, more than 100 kHz, more than 1 MHz, more than 10 MHz, less than 100 MHz, less than 10 MHz, less than 1 MHz, or other suitable low frequency to a high frequency of 10 kHz, more than 100 kHz, more than 1 MHz, more than 10 MHz, more than 10 MHz, less than 1 GHz, less than 100 MHz, less than 10 MHz, or other suitable high frequency), device 12 can determine what type of power receiving device 10 is present and can use this information to take appropriate action (e.g., by supplying wireless power to that device with device-appropriate settings, etc.). If desired, circuitry 42 may also discriminate between curves such as curves FS, D1, and D2 using smaller sets of measurements (e.g., a set of 2-10 data points, more than 2 data points, fewer than 5 data points, etc.).

Figure 9:
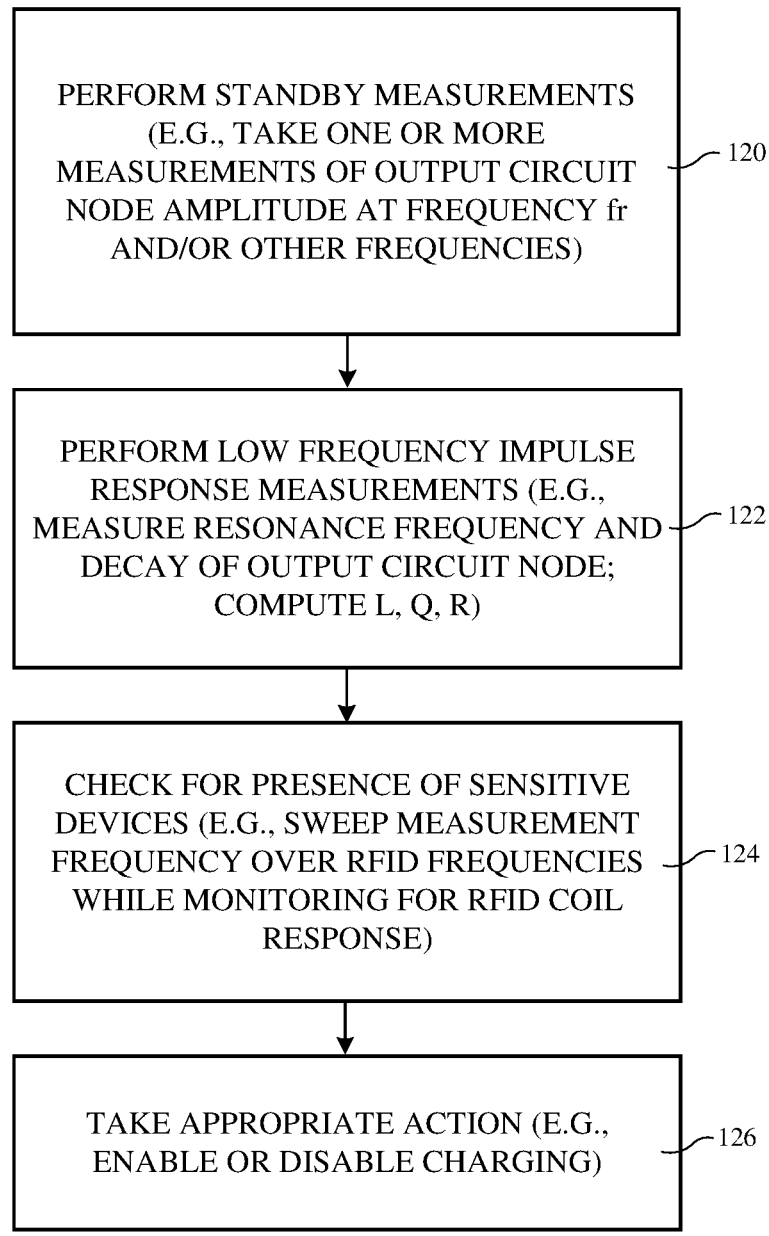
FIG. 9 is a flow chart of illustrative operations involved in operating a wireless power transfer system such as the wireless charging system of FIG. 1 in accordance with an embodiment.

FIG. 9 is a flow chart of illustrative operations involved in using system 8. During the operations of block 120, system 8 performs standby measurements. For example, device 12 may use circuitry such as circuit 78 of FIG. 3 to monitor one or more of coils 36 (e.g., each coil 36 in the array of coils 36 in device 12) for the presence of an external object such as one of devices 10 which is potentially compatible for wireless power transfer or an incompatible object such as a coin or badge. A single measurement at frequency fr may be made to determine whether OUT(N1) is lower than expected for any coils 36 or, if desired, multiple measurements at different frequencies near fr may be made (e.g., to determine which direction the coil resonance has shifted due to an external object and thereby help determine whether the object is an electronic device or is a coin or other incompatible foreign object). The standby operations of block 120 consume a low amount of power (e.g., 50 mW or less, 100 mW or less, more than 1 mW, or other suitable amount).

In response to detection of an external object with control circuitry 42 during the operations of block 120, control circuitry 42 performs additional detection operations such as low-frequency impulse response measurements (block 122). During the operations of block 122, control circuitry 42 may, for example, use inverter 72 or other resonant circuit drive circuitry to apply a stimulus (e.g., a square wave or other signal impulse) to the circuit formed from one or more of coils 36 (e.g., to each coil 36 in the array of coils 36 in device 12, a subset of these coils such as those for which foreign object presence has been detected during the operations of block 120, and/or other suitable sets of one or more of coils 36), thereby causing that circuit (and that coil 36) to resonate while using a measurement circuit such as impulse response measurement circuitry 76 of FIG. 3 to measure the response of the resonant circuit. As described in connection with FIG. 5, the characteristics of the resulting circuit resonance may then be measured and analyzed. For example, control circuitry 42 may use information on the measured resonant frequency to measure inductance and may use information on the decay of the signal resonance to determine resistance R and Q factor. If desired, the measurements of blocks 120 and/or 122 can be mapped in dimensions X and Y across surface 60 to help identify devices 10 and foreign objects.

If the operations of block 122 reveal that no foreign object is present and that an electronic device 10 is present, additional checking operations may be performed during block 124. In particular, frequency sweep measurements with circuitry such as oscillator circuitry 84 and swept-frequency measurement circuit 94 of FIG. 3 may be performed to check for the presence of a sensitive RFID device, as described in connection with FIG. 6.

Appropriate action are taken during the operations of block 126 based on the results of measurements such as the measurements of blocks 120, 122, and/or 124. If, as an example, a sensitive RFID device is detected during the operations of block 124 or if a foreign object is detected, wireless charging operations with all of coils 36 or an appropriate subset of coils 36 can be blocked. In response to detection of an electronic device 10 having a known characteristic L response (and/or Q response) and in response to determining that no RFID device is present after checking one or more of coils 36, as appropriate, with circuit 94 (e.g., the coils 36 for which L and/or Q measurements and/or other measurements indicate may be overlapped by an object or all of coils 36), control circuitry 42 can use wireless power transmitting circuitry 34 to transmit wireless power to wireless power receiving circuitry 46.

In some operating environments, signal measurement accuracy can be adversely affected by noise. For example, in arrangements in which multiple power receiving devices are located on a common wireless charging mat, the process of transmitting wireless power to one of the devices using coils in the mat that are overlapped by that device may create noise when making measurements such as impulse response measurements on another device that overlaps different coils in the mat. With one illustrative arrangement, potential interference can be avoided by stopping the charging of a first device for a sufficient amount of time to allow measurements such as impulse response measurements to be made on a second device in the absence of noise. With another illustrative arrangement, noise can be removed from measurements such as impulse response measurements.

Figure 10:
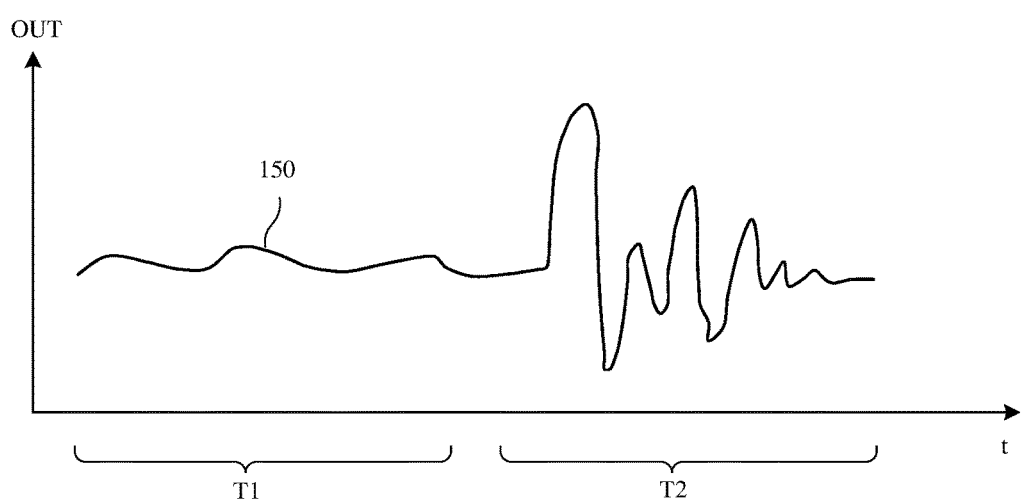
FIG. 10 is a graph showing signals associated with performing impulse response measurements in a noisy wireless charging environment in accordance with an embodiment.

FIG. 10 is a diagram showing how the measured signal on node N1 (or other suitable node) such as signal OUT may contain noise when attempting to make measurements on a coil overlapped by a wireless power receiving device. As shown by curve 150, signal OUT can initially be measured during time period T1 by impulse response measurement circuitry 76, in the absence of any applied impulse by impulse response measurement circuitry 76. There may be noise present in the signal OUT during time period T1 due to the charging of one or more additional wireless power receiving devices elsewhere on device 12 (e.g., overlapping other coils besides the coil/coils 36 overlapped by the wireless power receiving device). During time period T2, impulse response measurement circuitry 76 applies an impulse to coil 36 and measures the resulting ringing and exponential decay of the resulting signal OUT. Noise is present in this measured signal due to the wireless power transmission to one or more other devices on device 12. As described in connection with FIG. 5, the frequency and decay rate of the impulse response signal can reveal information such as the value of coil inductance L. To enhance measurement accuracy, the noise measured during period T1 can be removed from the signal measured during period T2 before processing the signal measured during period T2 to produce measurement results such as inductance L.

Figure 11:
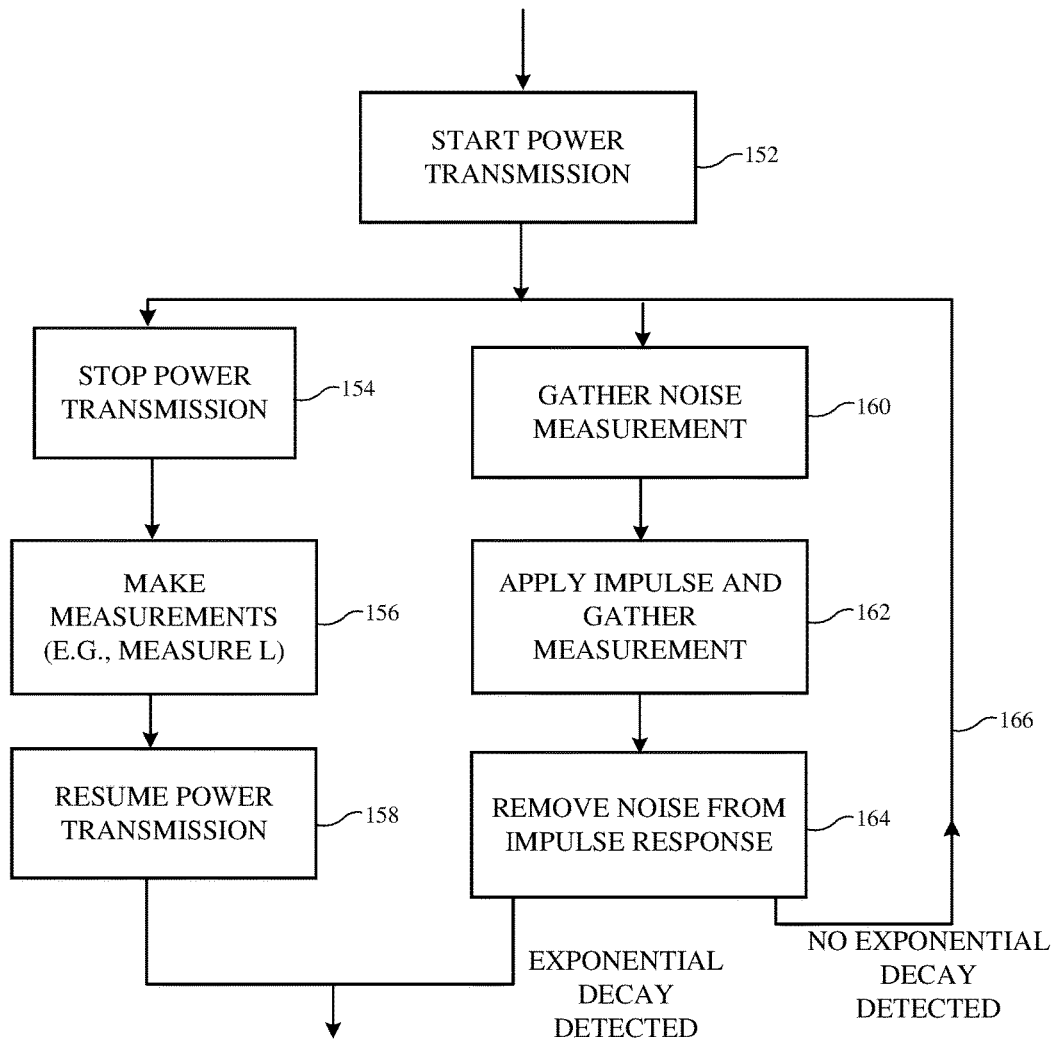
FIG. 11 is a flow chart of illustrative operations associated with making impulse response measurements in accordance with embodiments.

A flow chart of illustrative operations involved in measuring inductance L in a potentially noisy environment such as a charging environment in which multiple devices 10 are located on a common wireless power transmitting device 12 is shown in FIG. 11. As shown in FIG. 11, power transmission from device 12 to a first device 10 may be initiated at step 152.

With one illustrative approach, power transmission to the first device is momentarily suspended to permit measurement of L for a coil(s) overlapped with a second device. This approach is illustrated by the operations of blocks 154, 156, and 158. During the operations of block 154, device 12 stops power transmission to the first device. During the operations of block 156, impulse response measurement circuitry 76 is used to make impulse response measurements and thereby obtain L for the coil overlapped by the second device (e.g., while the first device is not receiving power). During the operations of block 158, power transmission from device 12 to the first device 10 is resumed. Power can also be wirelessly transmitted to the second device 10.

With another illustrative approach, which is illustrated in blocks 160, 162, and 164, noise is removed from the measured signals without interrupting power transmission to the first device. During the operations of block 160, measurement circuitry 76 or other measurement circuitry measures noise in signal OUT (see, e.g., period T1 of FIG. 10) for the coil(s) overlapped by the second device without interrupting power transmission to the first device. During the operations of block 162, the impulse response measurement circuitry 76 applies an impulse pulse to the coil(s) overlapped by the second device and measures signal OUT (see, e.g., period T2 of FIG. 10) while power continues to be transmitted to the first device using other coils in device 12 (thereby introducing noise into the signal measured during time period T2). During the operations of block 164, impulse response measurement circuitry 76 and/or control circuitry 42 removes the measured noise of period T2 from the impulse response signal of period T2 (e.g., by repeatedly subtracting the measured noise at various different trial phase values until satisfactory noise removal is achieved). If the noise is satisfactorily removed in this way (e.g., if an exponential decay in signal OUT is obtained and the measured value of L and/or other parameters is therefore obtained with satisfactory accuracy), impulse response measurement are complete and wireless power transmission operations may proceed. As shown by line 166, if noise is not satisfactorily removed during the operations of block 164, processing may loop back to block 160 to make additional noise and impulse response measurements.

System 8 allows device 12 to forgo charging of device 10 if a foreign object such as a radio-frequency identification (RFID) device is overlapped by device 10 and is therefore interposed between device 10 and one or more coils 36 in device 12. Because coils 36 can be controlled independently, if a RFID device or other sensitive device is detected on one portion of device 12 (e.g., overlapping a first set of one or more coils) while device 10 is detected on another portion of device 12 (e.g., overlapping a second set of one or more coils different from the first set of coils), device 12 can transmit power wirelessly using only the second set of coils and not the first set of coils. In this way, power is not wirelessly transmitted to the RFID device but is transmitted only to wireless power receiving device 10.

The foregoing is merely illustrative and various modifications can be made to the described embodiments. The foregoing embodiments may be implemented individually or in any combination.

What is claimed is:

1. A wireless power transmitting device with a charging surface, comprising:
    a coil;
    measurement circuitry coupled to the coil;
    wireless power transmitting circuitry coupled to the coil and configured to transmit wireless power signals to a wireless power receiving device with the coil; and
    control circuitry configured to control transmission of the wireless power signals, wherein the control circuitry is configured to operate in:
        a first mode in which the control circuitry uses the wireless power transmitting circuitry and the coil to transmit the wireless power signals to the wireless power receiving device without transmitting wireless power to a radio-frequency identification device detected with the measurement circuitry that overlaps a portion of the charging surface that is non-overlapping with the coil; and
        a second mode in which the control circuitry forgoes using the wireless power transmitting circuitry to transmit the wireless power signals to the wireless power receiving device upon detecting with the measurement circuitry that the radio-frequency identification device is overlapped by the wireless power receiving device.

2. The wireless power transmitting device of claim 1, wherein the control circuitry is further configured to detect foreign objects with the coil based at least partly on coil inductance information from the measurement circuitry.

3. The wireless power transmitting device of claim 1, wherein the measurement circuitry comprises:
    an output circuit that includes the coil;
    oscillator circuitry coupled to the output circuit;
    a first measurement circuit configured to measure signals in the output circuit while the oscillator circuitry produces output at a probe frequency; and
    a second measurement circuit configured to measure signals in the output circuit while the oscillator circuitry produces a frequency-swept output ranging from a first frequency to a second frequency.

4. The wireless power transmitting device of claim 3, wherein the measurement circuitry further comprises an impulse response measurement circuit configured to measure a response of the output circuit that includes the coil to an impulse signal, wherein the wireless power transmitting circuitry comprises an inverter, wherein the control circuitry is configured to supply the impulse signal to the coil with the inverter, and wherein the control circuitry is configured to measure an inductance associated with the coil using the impulse response measurement circuit.

5. The wireless power transmitting device of claim 4, wherein the control circuitry is configured to measure a Q factor associated with the coil using the impulse response measurement circuit.

6. The wireless power transmitting device of claim 5, wherein a frequency of 13.56 MHz lies between the first and second frequencies.

7. The wireless power transmitting device of claim 3, wherein the measurement circuitry further comprises an impulse response measurement circuit that is coupled to the output circuit and that is configured to make inductance and Q factor measurements, wherein the control circuitry is configured to control transmission of wireless power to the wireless power receiving device with the wireless power transmitting circuitry based at least partly on information from the impulse response measurement circuit.

8. The wireless power transmitting device of claim 3, wherein the control circuitry is configured to detect foreign objects overlapping the coil based at least partly on information from the first measurement circuit.

9. The wireless power transmitting device of claim 3, wherein the control circuitry is configured to detect the radio-frequency identification device overlapped by the wireless power receiving device based at least partly on information from the second measurement circuit.

10. The wireless power transmitting device of claim 3, wherein the wireless power receiving device is configured to overlap an area on the charging surface and wherein the control circuitry is configured to identify the area based at least partly on information from the first measurement circuit.

11. The wireless power transmitting device of claim 10, wherein the first measurement circuit includes a first peak detector and wherein the second measurement circuit comprises a second peak detector and a band pass filter.

12. The wireless power transmitting device of claim 11, wherein the wireless power transmitting circuitry comprises an inverter, wherein the control circuitry is configured to apply an impulse signal to the output circuit that includes the coil with the inverter, wherein the wireless power transmitting device further comprises an impulse response measurement circuit, wherein the control circuitry is configured to use the impulse response measurement circuit to measure a resonant frequency associated with the output circuit upon application of the impulse signal, and wherein the control circuitry is configured to control transmission of wireless power to the wireless power receiving device with the wireless power transmitting circuitry based at least partly on the measured resonant frequency.

13. A method of using a wireless power transmitting device having wireless power transmitting circuitry that transmits wireless power signals to a wireless power receiving device using a coil, comprising:
    operating the wireless power transmitting device in a first mode in which the wireless power transmitting device uses the coil to transmit the wireless power signals to the wireless power receiving device without transmitting wireless power to a radio-frequency identification device that overlaps a portion of the wireless power transmitting device non-overlapping with the coil; and
    operating the wireless power transmitting device in a second mode in which the wireless power transmitting device forgoes transmitting the wireless power signals to the wireless power receiving device upon detecting that the radio-frequency identification device is overlapped by the wireless power receiving device.

14. The method of claim 13 further comprising:
    detecting foreign objects on the wireless power transmitting device based at least partly on coil inductance information gathered from the coil.

15. The method of claim 14 further comprising:
    measuring signals in the wireless power transmitting device while oscillator circuitry in the wireless power transmitting device produces output at a probe frequency; and measuring signals in the wireless power transmitting device while the oscillator circuitry produces a frequency-swept output ranging from a first frequency to a second frequency.

16. The method of claim 15 further comprising:
measuring a response of the coil to an impulse signal.

17. The method of claim 16, wherein the wireless power transmitting device comprises an inverter, the method further comprising:
supplying the impulse signal to the coil with the inverter; and
measuring an inductance associated with the coil using an impulse response measurement circuit.

18. A non-transitory computer readable storage medium, comprising instructions for:
transmitting wireless power signals to a wireless power receiving device with wireless power transmitting circuitry coupled to a coil;
operating control circuitry in a first mode in which the control circuitry uses the wireless power transmitting circuitry and the coil to transmit the wireless power signals to the wireless power receiving device without transmitting wireless power to a radio-frequency identification device that overlaps a portion of the wireless power transmitting circuitry that is laterally separated from the coil; and
operating the control circuitry in a second mode in which the control circuitry forgoes using the wireless power transmitting circuitry to transmit the wireless power signals to the wireless power receiving device upon detecting that the radio-frequency identification device is overlapped by the wireless power receiving device.

19. The non-transitory computer readable storage medium of claim 18 further comprising instructions for detecting foreign objects based at least partly on coil inductance information gathered from the coil.

20. The non-transitory computer readable storage medium of claim 18 further comprising instructions for measuring a response of the coil to an impulse signal.

* * * * *